United States Patent
Chen

(10) Patent No.: US 9,726,729 B2
(45) Date of Patent: Aug. 8, 2017

(54) METHOD FOR CONTROLLING ELECTRIC MOTOR BY TRIGGER

(71) Applicant: CHERVON (HK) LIMITED, Wanchai (HK)

(72) Inventor: Wu Chen, Nanjing (CN)

(73) Assignee: Chevron (HK) Limited, Wanchai (HK)

( * ) Notice: Subject to any disclaimer, the term of this patent is extended or adjusted under 35 U.S.C. 154(b) by 0 days.

(21) Appl. No.: 15/090,139

(22) Filed: Apr. 4, 2016

(65) Prior Publication Data
US 2016/0301352 A1    Oct. 13, 2016

(30) Foreign Application Priority Data
Apr. 8, 2015  (CN) .......................... 2015 1 0163545

(51) Int. Cl.
*G01R 31/34*  (2006.01)

(52) U.S. Cl.
CPC .................................. *G01R 31/343* (2013.01)

(58) Field of Classification Search
CPC ....................................................... H02P 31/00
USPC .......................................... 318/490, 34, 558
See application file for complete search history.

(56) References Cited

U.S. PATENT DOCUMENTS 8,179,069 B2 *    5/2012    Matsunaga    ............... B25F 5/00
                                                        318/430

* cited by examiner

*Primary Examiner* — David S Luo
(74) *Attorney, Agent, or Firm* — Greenberg Traurig, LLP

(57) ABSTRACT

An example method for controlling an electric motor in an electric tool includes detecting travel of the trigger, selecting a smoothing coefficient N according to travel of the trigger in a predetermined time, driving the electric motor with an output duty ratio which is figured out by a formula in which the smoothing coefficient N is a denominator so as to cause the output duty ratio to be lesser than a preset duty ratio. The methods described will decrease the current impact on electric motors when users pull the trigger.

15 Claims, 3 Drawing Sheets

METHOD FOR CONTROLLING ELECTRIC MOTOR BY TRIGGER

This application claims the benefit of CN 201510163545.9, filed on Apr. 8, 2015, the disclosure of which is incorporated herein by reference in its entirety.

FIELD OF THE DISCLOSURE

The present disclosure relates generally to methods of controlling electric motors, and more particularly to a method for controlling an electric motor by a trigger.

BACKGROUND OF THE DISCLOSURE

At present, electric tools, such as an electric drill or an electric screw driver, include an electric motor and a trigger switch. The trigger switch has a trigger which is to be operated by a user; and the trigger switch can generate different signals in correspondence with the positions of the trigger when the user causes the trigger to move. For example, the electric motor is caused to be driven via use of a driving signal which has a duty ratio in correspondence with the signal of the trigger switch.

It is common that the trigger is pressed to move fast by the user when the user wants to activate the electric motor. In this condition, the duty ratio of the driving signal increases rapidly. When this occurs, the current of the electric motor may increase too fast, and the current impact on the electric motor may decrease the service life of the electric tool.

The statements in this section merely provide background information related to the present disclosure and may not constitute prior art.

SUMMARY

In one aspect of the disclosure, a method of controlling an electric motor by a trigger is provided. The method includes the steps of: detecting a first position value which corresponds to the position of the trigger at the start of a predetermined time; detecting a second position value which corresponds to the position of the trigger at the end of the predetermined time; calculating a difference value between the first position value and the second position value; determining whether the difference value $\Delta L$ is greater than 0; selecting a smoothing coefficient according to the difference value when the difference value is greater than 0; calculating an output duty ratio in accordance with the equation $$D_N = \frac{D_{N-1}(N-1) + D_R}{N},$$

wherein $D_N$ stands for the output duty ratio, $D_{N-1}$ stands for the output duty ratio which is calculated out in the last calculation, N stands for the smoothing coefficient, and $D_R$ stands for a preset duty ratio according to the position of the trigger; and driving the electric motor with the output duty ratio.

Furthermore, the method may include presetting a plurality of preset duty ratios which correspond to a plurality of positions of the trigger.

Furthermore, the method may include driving the electric motor with the preset duty ratio when the difference value is less than or equal to 0.

Furthermore, the method may include presetting a plurality of value ranges for the difference value where one value range corresponds to one smoothing coefficient and the smoothing coefficient is selected according to the correspondence with the value range which the difference value falls within.

Furthermore, the smoothing coefficient which corresponds to the greater difference value is greater than the smoothing coefficient which corresponds to the lesser difference value.

In another aspect of the disclosure, another method of controlling an electric motor by a trigger is provided. This method includes the steps of: detecting the travel of the trigger; selecting a smoothing coefficient N according to the travel of the trigger in a predetermined time; calculating an output duty ratio in accordance with the equation $$D_N = \frac{D_{N-1}(N-1) + D_R}{N},$$

wherein $D_N$ stands for the output duty ratio, $D_{N-1}$ stands for the output duty ratio which is calculated out in the last calculation, N stands for the smoothing coefficient, and $D_R$ stands for a preset duty ratio according to the position of the trigger; and driving the electric motor with the output duty ratio.

In another aspect of the disclosure, another method of controlling an electric motor by a trigger is provided. This method includes the steps of: detecting a first duty ratio D1 which corresponds to the position of the trigger at the start of a predetermined time; detecting a second duty ratio which corresponds to the position of the trigger at the end of the predetermined time; calculating a difference value between the first duty ratio and the second duty ratio; determining whether the difference value is greater than 0; selecting a smoothing coefficient N according to the difference value when the difference value is greater than 0; calculating an output duty ratio in accordance with the equation $$D = D1 + \frac{\Delta D}{N},$$

wherein D stands for the output duty ratio, D1 stands for the first duty ratio, $\Delta D$ stands for the difference value, and N stands for the smoothing coefficient; and driving the electric motor with the output duty ratio.

Furthermore, the method may include presetting a plurality of preset duty ratios which correspond to a plurality of positions of the trigger.

Furthermore, the method may include driving the electric motor with the second duty ratio D2 when the difference value is less than or equal to 0.

Furthermore, the method may include presetting a plurality of value ranges for the difference value where one value range corresponds to one smoothing coefficient and the smoothing coefficient is selected according to the correspondence with the value range which the difference value falls within.

Furthermore, the smoothing coefficient which corresponds to the greater difference value is greater than the smoothing coefficient which corresponds to the lesser difference value. The minimum of the smoothing coefficients is 1.

Further areas of applicability will become apparent from the description provided herein. It should be understood that the description and specific examples are intended for purposes of illustration only and are not intended to limit the scope of the present disclosure.

Figure 1:
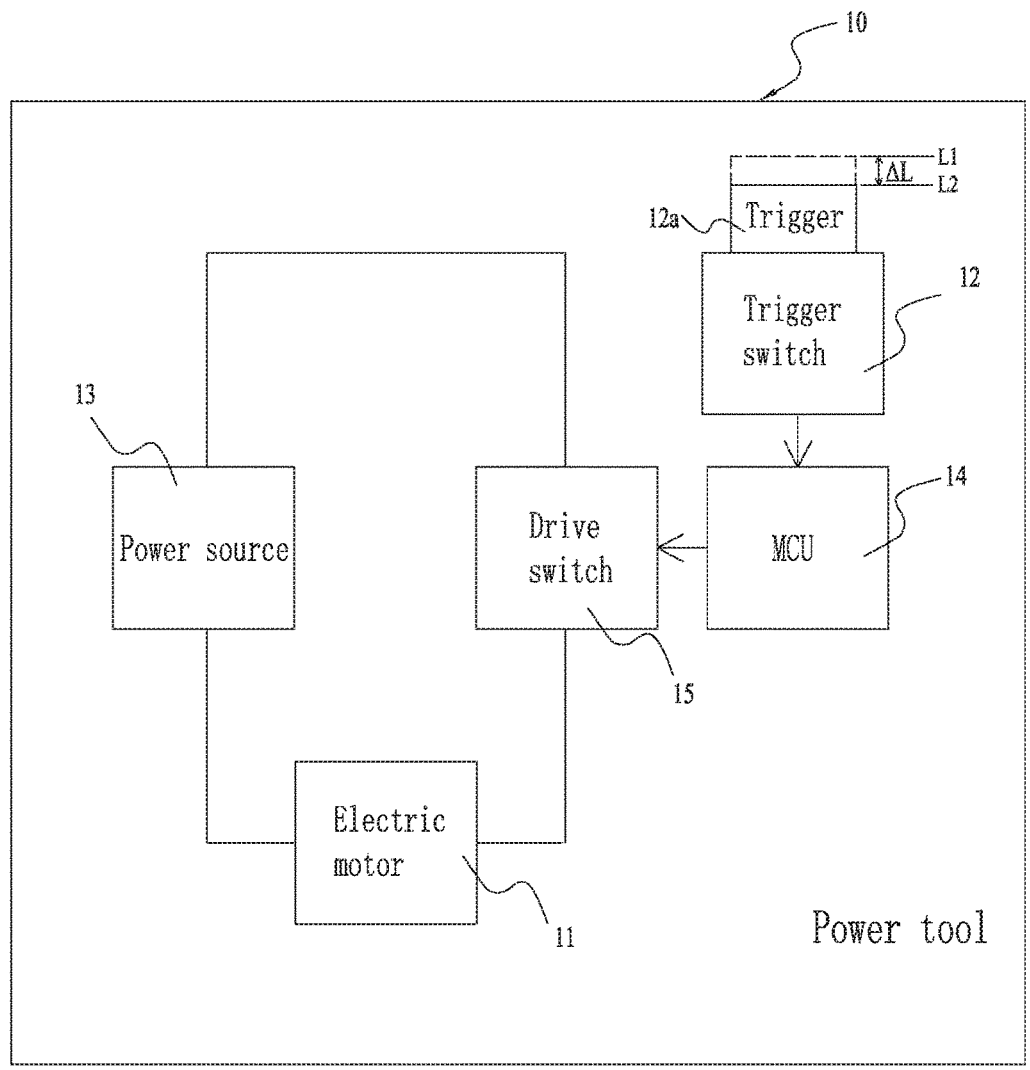
FIG. 1 is a block diagram of an exemplary configuration for an electric tool.

The drawings described herein are for illustrative purposes only of exemplary embodiments and not all possible implementations, and are not intended to limit the scope of the present disclosure. Corresponding reference numerals indicate corresponding parts throughout the several views of the drawings.

DETAILED DESCRIPTION

The following description of the preferred embodiments is merely exemplary in nature and is in no way intended to limit the invention hereinafter claimed, its application, or uses.

As shown in FIG. 1, an electric tool 10 includes an electric motor 11, and a trigger switch 12. The trigger switch 12 has a trigger 12a which is to be operated by a user; and the trigger switch 12 can generate different signals in correspondence with the positions of the trigger 12a when the user causes the trigger 12a to move.

The electric tool 10 is also provided with a power source 13, a MCU 14 and a drive switch 15. The power source 13 is configured to provide electric energy for the electric motor 11. The MCU 14 is provided for controlling the drive switch 15 according to the signals of the trigger switch 12 which are sent to the MCU 14. The MCU 14 can switch the drive switch 15 on or off in a certain duty ratio by sending signals to the drive switch 15. The drive switch 15 is connected between the electric motor 11 and the power source 13 and, when the drive switch 15 is on, the electric motor 11 connects to the power source 13 so as to cause a current to pass through the electric motor 11.

Figure 2:
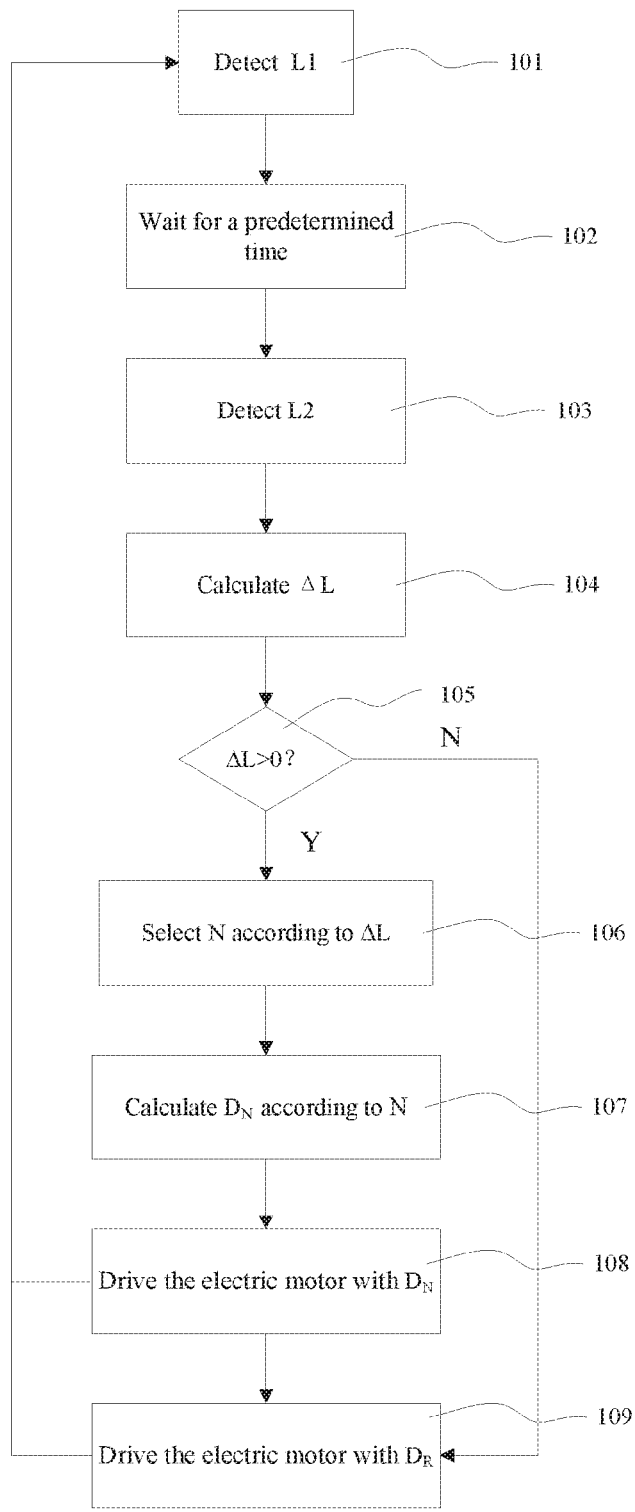
FIG. 2 is a flow flowchart illustrating an exemplary method of controlling an electric motor with a trigger.

As shown in FIG. 2, a method is provided to control the electric motor 11 in the electric tool 10 as shown in FIG. 1. The illustrated method includes the following steps:

101: detecting a first position value which corresponds to the position of the trigger 12a;

102: waiting for a predetermined time;

103: detecting a second position value which corresponds to the position of the trigger 12a;

104: calculating a difference value between the first position value and the second position value in accordance with the equation $\Delta L = L2 - L1$, wherein $\Delta L$ stands for the difference value, L1 stands for the first position value, and L2 stands for the second position.

105: determining whether the difference value is greater than 0 and, when the difference value is greater than 0, moving to step 106, and, when the difference value is less than or equal to 0, moving to step 109;

106: selecting a smoothing coefficient N according to the difference value;

107: calculating an output duty ratio in accordance with the equation:

$$D_N = \frac{D_{N-1}(N-1) + D_R}{N} \quad (1)$$

Wherein $D_N$ stands for the output duty ratio, $D_{N-1}$ stands for the output duty ratio which is calculated in the last calculation, N stands for the smoothing coefficient, and $D_R$ stands for a preset duty ratio according to the position of the trigger 12a.

108: driving the electric motor 11 with the output duty ratio and then returning to step 101; and

109: driving the electric motor 11 with the preset duty ratio and then returning to step 101.

The steps above are performed by the electric tool 10 as shown in FIG. 1. It is to be understood that, when a user press the trigger 12a and it is first time to perform the step 107, $D_{N-1}$ is set to 0.

The predetermined time may be a very short time, such as a millisecond, a microsecond and so on. The predetermined time may be depended on the presetting of the manufacturer and the clock frequency of the MCU.

The MCU 14 can detect the position values by detecting the signals of the trigger switch 12 which corresponds to the positions of the trigger 12a. The MCU 14 can also perform the timing, calculating, determining and outputting control signal with a duty ratio to the drive switch 15. Certainly, these steps can also be performed by different device of an electric tool 10.

The method can also be performed by using other parameter which correspond to the positions of the trigger 12a, such as strength of the signals from the trigger switch 12.

The trigger switch 12 can generate signals which correspond to the positions of the trigger 12a, and the MCU 14 can output signals for driving the electric motor with a duty ratio only according to the correspondence between the duty ratio and the signal from the trigger switch 12 if the difference value is less than or equal to 0.

The duty ratios which depend only on the positions of the trigger 12a are defined as the true duty ratios. The preset duty ratios depend only on the positions of the trigger 12a rather than the speed of movement of the trigger 12a.

The method as shown in FIG. 2 may further include a step for setting a correspondence between the preset duty ratios and the positions of the trigger 12a so the MCU 14 can calculate the output duty ratios according to the preset duty ratios when users move the trigger 12a fast and can output duty ratios in correspondence with the position of the trigger 12a when users move the trigger 12a gently.

The method may further preset a plurality of value ranges for the difference value. The MCU 14 stores the dates of the value ranges, smoothing coefficients and the correspondence between them.

When the difference value falls in one of the value ranges, the method selects the smoothing coefficient according to the correspondence between smoothing coefficients and the value ranges.

The smoothing coefficient which corresponds to the greater difference value is greater than the smoothing coefficient which corresponds to the lesser difference value. By using this measure, the duty ratio for driving the motor will be effectively controlled when the trigger 12a is pulled fast.

Figure 3:
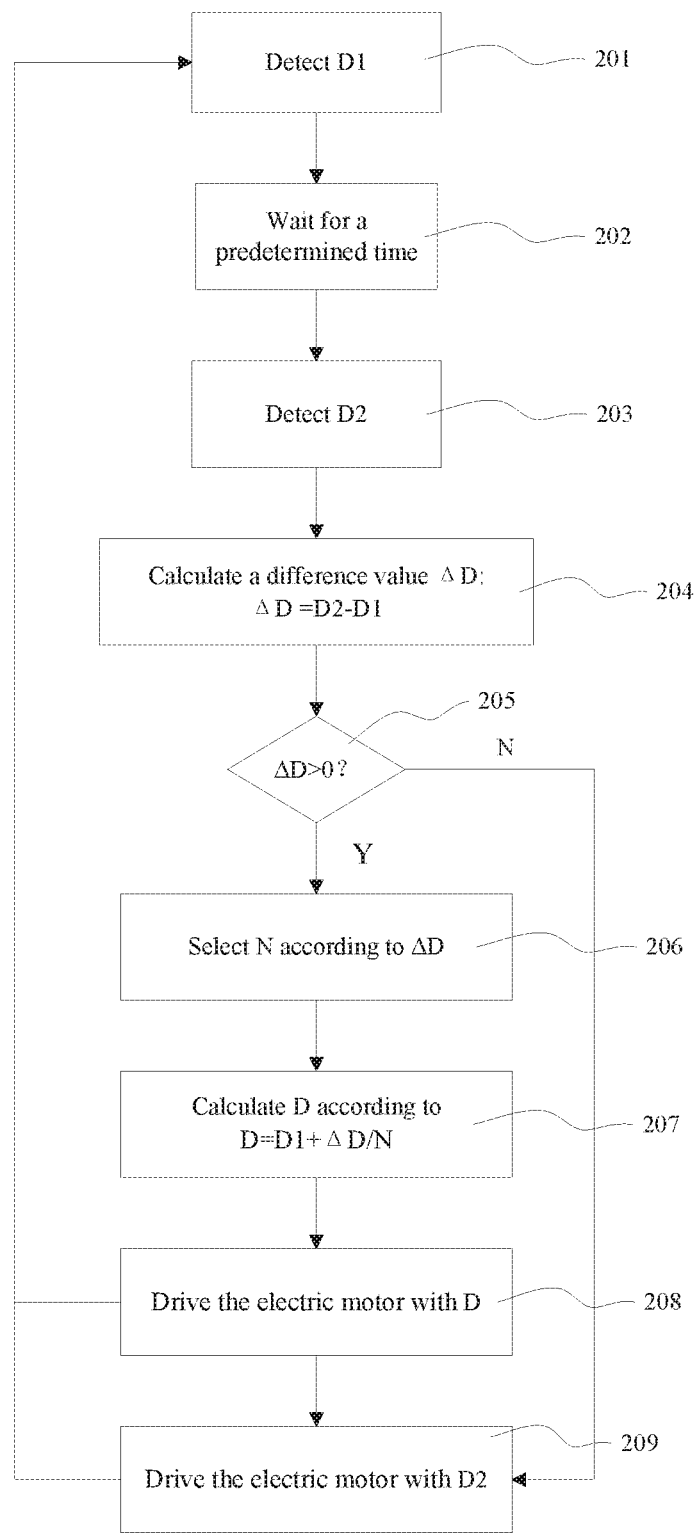
FIG. 3 is a flow flowchart illustrating another exemplary method of controlling an electric motor with a trigger.

As shown in FIG. 3, a method is also provided to control the electric motor 11 in the electric tool 10 as shown in FIG. 1. This method includes the following steps:

201: detecting a first duty ratio D1 which corresponds to the position of the trigger;

202: waiting for a predetermined time;

203: detecting a second duty ratio D2 which corresponds to the position of the trigger;

204: calculating a difference value between the first duty ratio and the second duty ratio in accordance with the equation ΔD=D2−D1, wherein ΔD stands for the difference value, D1 stands for the first duty ratio, and D2 stands for the second duty ratio.

205: determining whether the difference value is greater than 0 and, when the difference value is greater than 0 moving to step 206 and, when the difference value is less than or equal to 0, moving to step 209;

206: selecting a smoothing coefficient N according to the difference value.

207: calculating an output duty ratio in accordance with the equation:

$$D = D1 + \frac{\Delta D}{N} \quad (2)$$

wherein D stands for the output duty ratio, D1 stands for the first duty ratio, ΔD stands for the difference value, and N stands for the smoothing coefficient.

208: driving the electric motor 11 with the output duty ratio and then returning to step 201;

209: driving the electric motor 11 with the second duty ratio and then returning to step 201.

If it is the first time performing step 207, D1 is set to 0.

The method as shown in FIG. 3 may further include a step for setting a correspondence between the preset duty ratios and the positions of the trigger 12a so the MCU 14 can calculate the output duty ratios according to the preset duty ratios when users move the trigger 12a fast and can output duty ratios in correspondence with the position of the trigger 12a when users move the trigger 12a gently.

The trigger switch 12 can generate signals which correspond to the positions of the trigger 12a. The MCU 14 can receive the signals from the trigger switch 12 and figure out the preset duty ratios that correspond with the positions of the trigger 12a.

The first duty ratio and the second duty ratio may be the duty ratio of the trigger switch 12 or the duty ratio of the drive switch 15.

Similar to the previous method, this method may also further preset a plurality of value ranges for the difference value. The MCU 14 stores the dates of the value ranges, smoothing coefficients and the correspondence between them. When the difference value falls in one of the value ranges, the method selects the smoothing coefficient according to the correspondence between smoothing coefficients and the value ranges.

In this method, the smoothing coefficient which corresponds to the greater difference value is also greater than the smoothing coefficient which corresponds to the lesser difference value, and the minimum of the smoothing coefficients is 1.

Summarily, the methods which are described above may include some additional steps as following: detecting the travel of the trigger 12a; selecting a smoothing coefficient N according to the travel of the trigger 12a in a predetermined time; driving the electric motor 11 with the output duty ratio $D_N$ which is figured out by a formula that the smoothing coefficient N to be a denominator so as to cause the output duty ratio $D_N$ to be less than the preset duty ratio.

The above illustrates and describes basic principles, main features and advantages of the present invention. Those skilled in the art should appreciate that the above embodiments do not limit the claimed invention in any form. Technical solutions obtained by equivalent substitution or equivalent variations all fall within the scope of the claimed invention.

What is claimed is:

1. A method for controlling an electric motor by a trigger, comprising:
    detecting a first position value which corresponds to a position of the trigger at a start of a predetermined time;
    detecting a second position value which corresponds to the position of the trigger at an end of the predetermined time;
    calculating a difference value between the first position value and the second position value;
    determining whether the difference value is greater than 0;
    selecting a smoothing coefficient according to the difference value when the difference value is greater than 0;
    calculating an output duty ratio in accordance with the equation:

$$D_N = \frac{D_{N-1}(N-1) + D_R}{N}$$

in which
    $D_N$ stands for the output duty ratio;
    $D_{N-1}$ stands for an output duty ratio which is calculated out in a last calculation;
    N stands for the smoothing coefficient;
    $D_R$ stands for a preset duty ratio according to a position of the trigger; and
    driving the electric motor with the output duty ratio.

2. The method of the claim 1, further comprising presetting a plurality of preset duty ratios which correspond to a plurality of positions of the trigger.

3. The method of the claim 2, further comprising driving the electric motor with the preset duty ratio when the difference value ΔL is less than or equal to 0.

4. The method of the claim 1, further comprising presetting a plurality of value ranges for the difference value wherein one value range corresponds to one smoothing coefficient and the smoothing coefficient is selected according to a correspondence with the value range which the difference value falls within.

5. The method of the claim 4, wherein the smoothing coefficient which corresponds to a greater difference value is greater than the smoothing coefficient which corresponds to a lesser difference value.

6. The method of the claim 1, further comprising presetting a plurality of travel ranges for travels of the trigger wherein one travel range corresponds to one smoothing coefficient and the smoothing coefficient is selected according to the correspondence with the travel range which the travel of the trigger falls within.

7. The method of the claim 6, wherein the smoothing coefficient when the trigger moves fast is greater than the smoothing coefficient when the trigger moves slowly.

8. A method of controlling an electric motor by a trigger, comprising:
    detecting travel of the trigger;
    selecting a smoothing coefficient according to travel of the trigger in a predetermined time;

calculating an output duty ratio in accordance with the equation:

$$D_N = \frac{D_{N-1}(N-1) + D_R}{N}$$

in which
 $D_N$ stands for the output duty ratio;
 $D_{N-1}$ stands for an output duty ratio which is calculated out in a last calculation;
 N stands for the smoothing coefficient;
 $D_R$ stands for a preset duty ratio according to a position of the trigger; and
 driving the electric motor with the output duty ratio.

9. The method of the claim 8, further comprising presetting a plurality of preset duty ratios which correspond to a plurality of positions of the trigger.

10. A method of controlling an electric motor by a trigger, comprising:
 ascertaining a first duty ratio which corresponds to a position of the trigger at a start of a predetermined time;
 ascertaining a second duty ratio which corresponds to a position of the trigger at an end of the predetermined time;
 calculating a difference value between the first duty ratio and the second duty ratio;
 determining whether the difference value is greater than 0;
 selecting a smoothing coefficient according to the difference value when the difference value is greater than 0;
 calculating an output duty ratio in accordance with the equation $$D = D1 + \frac{\Delta D}{N}$$

in which
 D stands for the output duty ratio;
 D1 stands for the first duty ratio;
 $\Delta D$ stands for the difference value;
 N stands for the smoothing coefficient; and
 driving the electric motor with the output duty ratio.

11. The method of the claim 10, further comprising presetting a plurality of preset duty ratios which correspond to a plurality of positions of the trigger.

12. The method of the claim 10, further comprising driving the electric motor with the second duty ratio when the difference value $\Delta D$ is less than or equal to 0.

13. The method of the claim 10, further comprising presetting a plurality of value ranges for the difference value wherein one value range corresponds to one smoothing coefficient and the smoothing coefficient is selected according to the correspondence with the value range which the difference value falls within.

14. The method of the claim 10, wherein the smoothing coefficient which corresponds to a greater difference value is greater than the smoothing coefficient which corresponds to a lesser difference value.

15. The method of the claim 10, wherein the minimum of the smoothing coefficients is 1.

* * * * *

UNITED STATES PATENT AND TRADEMARK OFFICE
CERTIFICATE OF CORRECTION

| | |
|---|---|
| PATENT NO. | : 9,726,729 B2 |
| APPLICATION NO. | : 15/090139 |
| DATED | : August 8, 2017 |
| INVENTOR(S) | : Wu Chen |

It is certified that error appears in the above-identified patent and that said Letters Patent is hereby corrected as shown below:

On the Title Page

(73) Assignee: [Chevron] should be "Chervon"

Signed and Sealed this
Ninth Day of July, 2024

Katherine Kelly Vidal
*Director of the United States Patent and Trademark Office*